United States Patent
Lee et al.

(10) Patent No.: US 6,235,580 B1
(45) Date of Patent: May 22, 2001

(54) PROCESS FOR FORMING A CROWN SHAPED CAPACITOR STRUCTURE FOR A DRAM DEVICE

(75) Inventors: Yu-Hua Lee, Hsin-chu; Cheng-Ming Wu, Kao-Hsiung; Wen-Chuan Chiang, Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/467,123

(22) Filed: Dec. 20, 1999

(51) Int. Cl.[7] .................................................. H01L 21/8242
(52) U.S. Cl. ........................................... 438/253; 438/254
(58) Field of Search ..................................... 438/253–256, 438/238, 381, 396–399

(56) References Cited

U.S. PATENT DOCUMENTS

| | | | |
|---|---|---|---|
| 5,700,731 | 12/1997 | Lin et al. ........................... | 438/381 |
| 5,753,547 | 5/1998 | Ying ................................... | 438/253 |
| 5,821,141 | 10/1998 | Huang ................................ | 438/253 |
| 5,893,734 | 4/1999 | Jeng et al. ......................... | 438/239 |
| 5,937,322 | 8/1999 | Matsuura .......................... | 438/622 |
| 6,083,831 | * 7/2000 | Dennison ......................... | 438/666 |

* cited by examiner

*Primary Examiner*—Jey Tsai
(74) *Attorney, Agent, or Firm*—George O. Saile; Stephen B. Ackerman

(57) ABSTRACT

A process for forming crown shaped capacitor structures, for a DRAM device, has been developed. The process features the use of a disposable insulator layer, applied prior to photolithographic and dry etching procedures, used to define the capacitor upper plate structures. The disposable insulator layer alleviates the topography effects presented by crown shaped storage node structures, relaxing the complexity of the patterning of the capacitor upper plate structures.

18 Claims, 5 Drawing Sheets

PROCESS FOR FORMING A CROWN SHAPED CAPACITOR STRUCTURE FOR A DRAM DEVICE

BACKGROUND OF THE INVENTION

(1) Field of the Invention

This invention relates to methods used to fabricate semiconductor devices, and more specifically to a process used to form a crown shaped, capacitor structure, for a dynamic random access memory, (DRAM), device.

(2) Description of Prior Art

To increase performance of DRAM devices, the semiconductor industry has concentrated on increasing the signal, or capacitance, of the DRAM capacitor structure. The use of crown shaped, or cylindrical shaped, stacked capacitor structures, has allowed the desired capacitance increases to be realized via the additional surface area offered with the use of crown shaped storage node structures. However the topography of the crown shaped storage node structure, can lead to difficulties when attempting to fabricate a polysilicon capacitor upper plate structure, overlying the severe underlying topography. The definition of the polysilicon capacitor upper plate structure, via conventional photolithographic and dry etching procedures, is aggravated by the height of the vertical features, and by the spaces between the vertical features, of the underlying crown shaped storage node structure. The use of thick photoresist layers, needed to insure filling of the spaces between the vertical features of the crown shaped storage node structures, can result in a decreasing resolution of photoresist shape used to define the capacitor upper plate structure. In addition the anisotropic, reactive ion etching, (RIE), needed to define the capacitor upper plate structure, becomes more difficult when attempting to remove regions of polysilicon located on the vertical sides of the underlying crown shaped storage node structures.

This invention will describe a process for creating a crown shaped capacitor structure, featuring the use of a spin-on glass, (SOG), layer, used overlying the polysilicon layer that will be subjected to the definition procedures used for the polysilicon capacitor upper plate structure. The use of the planarizing SOG layer alleviates the severity of the subsequent photolithographic and dry etching procedures, used for definition of the capacitor upper plate structure. After definition of the polysilicon, capacitor upper plate structure, for the crown shaped capacitor structure, the SOG layer is selectively removed via use of a buffered hydrofluoric acid solution. Prior art such as Matsuura, in U.S. Pat. No. 5,937,322, as well as Lin et al, in U.S. Pat. No. 5,700,731, describe processes for fabricating crown shaped capacitor structures, however those prior arts do not describe the novel use of a disposable SOG layer, normalizing the severe topography of the underlying crown shaped storage node structure, reducing the severity of subsequent photolithographic and RIE procedures, used to define an overlying polysilicon capacitor upper plate structure.

SUMMARY OF THE INVENTION

It is an object of this invention to fabricate a crown shaped capacitor structure for a DRAM device.

It is another object of this invention to use a SOG layer to fill the spaces between the vertical features of the crown shaped storage node structures, after deposition of the polysilicon layer, allowing photolithographic and dry etrching procedures, used to definer the polysilicon capacitor upper plate structure, to be performed on a less severe topography.

It is still another object of this invention to define the capacitor upper plate structure, in the SOG layer, and in the underlying polysilicon layer, via a photolithographic and RIE procedure, followed by selective removal of the SOG layer from the underlying polysilicon, capacitor upper plate structure.

In accordance with the present invention a process for fabricating a crown shaped capacitor structure, for a DRAM device, featuring a disposable SOG layer, used to reduce the topography created by underlying crown shaped storage node structures, prior to the subsequent definition of a capacitor upper plate structure, is described. Polysilicon, crown shaped storage node structures are formed, overlying, and contacting, conductive plug structures, which in turn overlay, and contact, active device regions in the transfer gate transistors. After formation of a capacitor dielectric layer, and an overlying polysilicon layer, on the crown shaped storage node structures, a SOG layer is applied on the underlying polysilicon layer, filling the spaces between the vertical features of the crown shaped storage node structures. After a partial etch back of the SOG layer, a photoresist shape, used for subsequent definition of a polysilicon, capacitor upper plate structure, is formed on the thinned SOG layer. A wet etch procedure is used to remove SOG layer, exposed in an opening in the photoresist shape, exposing a portion of the polysilicon layer, located between the vertical features of the crown shape storage node structures. An anisotropic RIE procedure is next employed to remove the exposed regions of the polysilicon layer, resulting in the definition of the polysilicon, capacitor upper plate structure. After removal of the photoresist layer, used for definition of the capacitor upper plate structure, another wet etch dip is used to remove remaining areas of the SOG layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The process of fabricating a crown shaped capacitor structure, for a DRAM device, featuring the use of a disposable SOG layer, used to alleviate the severe topography of underlying crown shaped storage node structures, that can adversely influence the definition of an overlying capacitor upper plate patterning procedure, will now be described in detail. A P type, semiconductor substrate 1, comprised of single crystalline silicon, with a <100> crystallographic orientation, is used and schematically shown in FIG. 1. A silicon dioxide, gate insulator layer 2, is thermally grown, in an oxygen—steam ambient, to a thickness between about 20 to 100 Angstroms, followed by the deposition of a polysilicon layer, via low pressure chemical vapor deposition, (LPCVD), procedures, to a thickness between about 500 to 2000 Angstroms. The polysilicon layer can be doped in situ, during deposition via the addition of arsine, or phosphine, to a silane ambient, or the polysilicon layer can be deposited intrinsically then doped via ion implantation, using arsenic or phosphorous ions. Conventional photolithographic and anisotropic RIE procedures, using $Cl_2$ as an etchant, are used to define polysilicon gate structure 3, shown schematically in FIG. 1. If decreased word line resistance is desired, a polycide, (metal silicide-polysilicon), gate structure can be formed. The photoresist shape, used for definition of polysilicon gate structure 3, is removed using plasma oxygen ashing and careful wet cleans, with the wet clean procedures comprised with a buffered hydrofluoric, (BHF), cycle, resulting in the removal of the regions of silicon dioxide, gate insulator layer 2, not covered by polysilicon gate structures 3.

Figure 1:
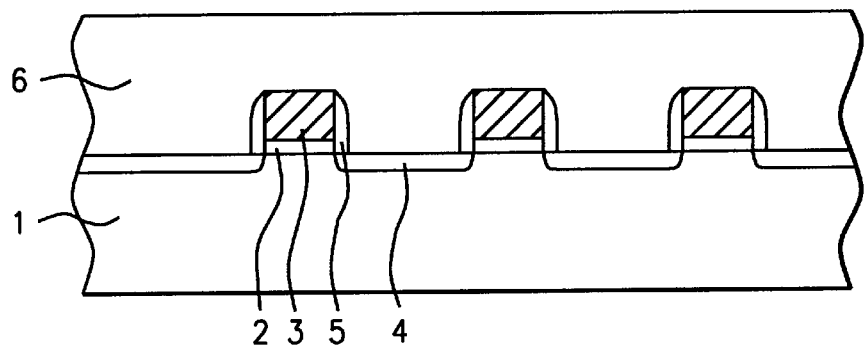
FIGS. 1–11, which schematically, in cross-sectional style, describe the key stages of fabrication used to create a crown shaped capacitor structure, featuring the use of a SOG layer, employed to alleviate the topography effects, resulting from underlying crown shaped storage node structures, that can adversely influemce the definition of an overlying polysilicon, capacitor upper plate structure.

Lightly doped source/drain regions 4, are next formed in regions of semiconductor substrate 1, not covered by polysilicon gate structures 3. This is accomplished via ion implantation of arsenic, or phosphorous ions, at an energy between about 10 to 80 KeV, at a dose between about 1E13 to 5E14 atoms/$cm^2$. This invention is described using N channel devices, however this invention can also be applied to P channel DRAM devices, via use of an N well region, in the P type semiconductor substrate, and via the creation of P type, lightly doped source/drain regions. An insulator layer such as silicon oxide, or silicon nitride, is next deposited via LPCVD or plasma enhanced chemical vapor deposition, (PECVD), procedures, to a thickness between about 500 to 2000 Angstroms. Anisotropic RIE procedures using $CHF_3$, are then used to create insulator spacers 5, on the sides of polysilicon gate structures 3. Insulator layer 6, comprised of a borophosphosilicate glass, (BPSG), layer, or of silicon oxide layer, is next deposited via LPCVD or PECVD procedures, to a thickness between about 8000 to 12000 Angstroms. A chemical mechanical polishing, (CMP), procedure, is next employed for planarization purposes, resulting in a smooth top surface topography for insulator layer 6. This is schematically shown in FIG. 1.

Figure 2:
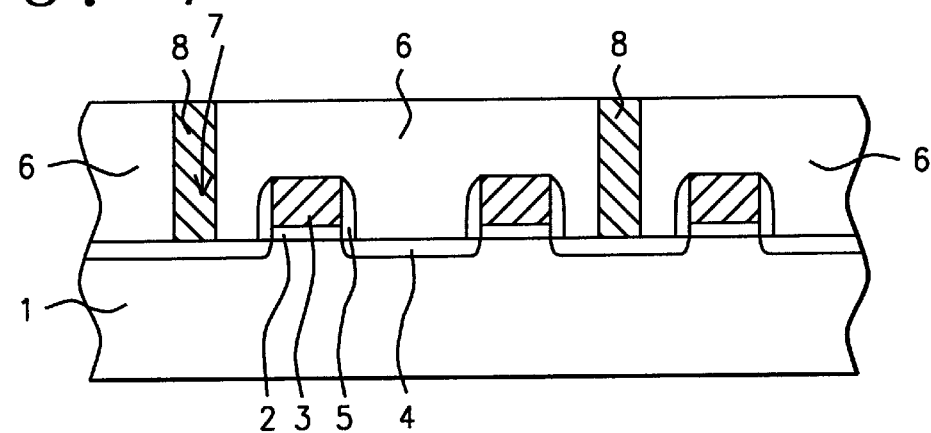

The formation of conductive plug structures 8, in contact hole openings 7, is next addressed, and shown schematically in FIG. 2. Conventional photolithographic and RIE procedures, using $CHF_3$ as an etchant, are used to create contact hole openings 7, in insulator layer 6, exposing a portion of the top surface of lightly doped source/drain regions 4. After removal of the photoresist shape used for definition of contact hole openings 7, via plasma oxygen ashing and careful wet cleans, a conductive layer, such as polysilicon, is deposited via LPCVD procedures, to a thickness between about 3000 to 6000 Angstroms, completely filling contact hole openings 7. The polysilicon layer is doped in situ, during deposition, via the addition of arsine of phosphine, to a silane ambient. A CMP procedure, or a selective RIE procedure, using $Cl_2$ as an etchant, is then used to remove regions of the polysilicon layer from the top surface of insulator layer 6, resulting in conductive plug structures 8, in contact hole openings 7. This is schematically shown in FIG. 2. If desired conductive plugs 8, can be comprised of tungsten, obtained via deposition of a tungsten layer, via LPCVD procedures, and defined via a CMP or via a RIE procedure.

Figure 3:
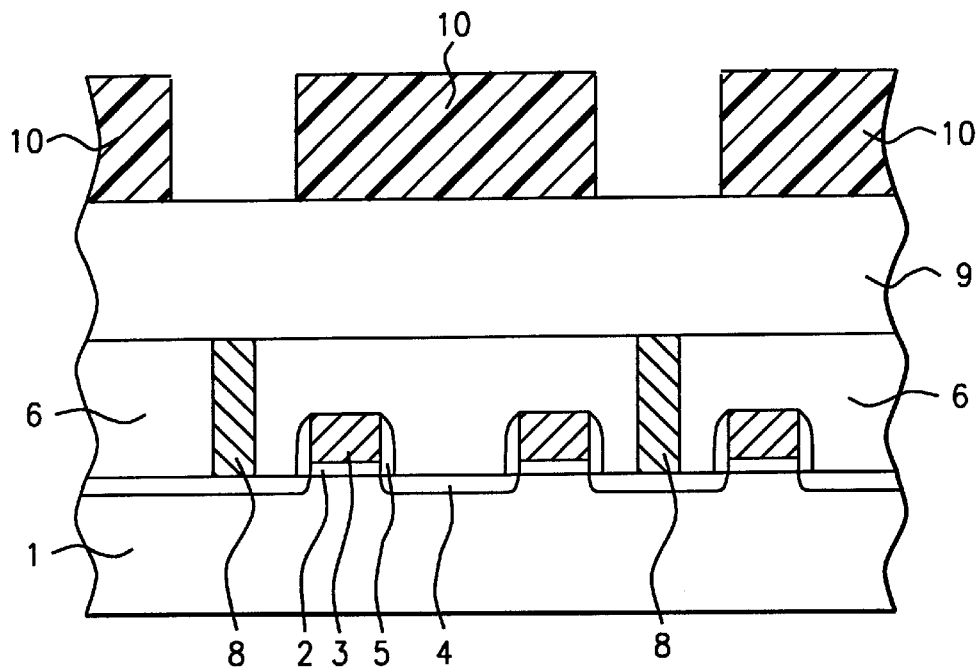
Figure 4:
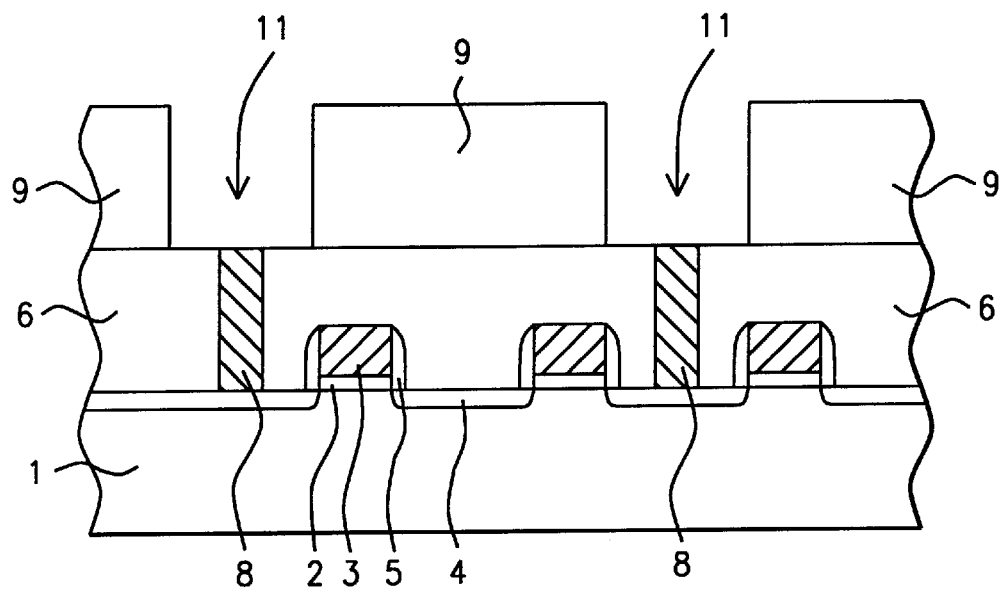
Figure 5:
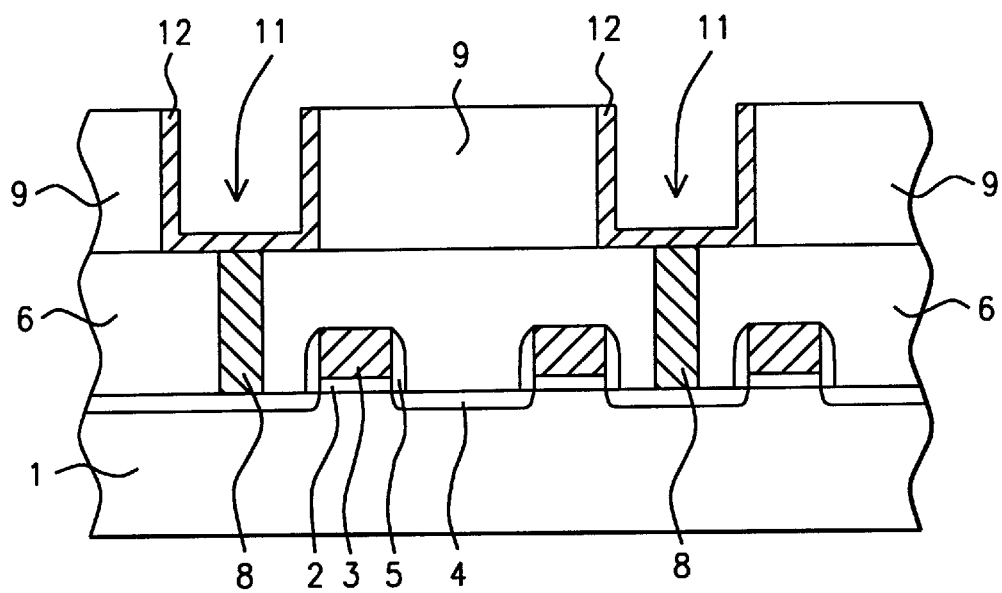

Insulator layer 9, comprised of either a BPSG layer, or a silicon oxide layer, is next deposited using LPCVD or PECVD procedures, at a thickness between about 10000 to 16000 Angstroms. Photoresist shape 10, shown schematically in FIG. 3, is next formed on insulator layer 9. An anisotropic RIE procedure, using $CHF_3$ as an etchant, is used to form storage node openings 11, in insulator layer 9, exposing the top surface of conductive plug structures 8. This is schematically shown in FIG. 4. Photoresist shape 10, is then removed via plasma oxygen ashing and careful wet cleans. If desired a composite insulator layer 9, comprisesd of an overlying layer of silicon oxide, or BPSG, and a thin, underlying layer of silicon nitride, can be used, with storage node openings then formed in composite insulator layer 9. The use of the thin, underlying silicon nitride layer will allow a subsequent, wet etch removal of the silicon oxide portion of the composite insulator layer, to be accomplished with improved selectively. A polysilicon layer is next deposited via LPCVD procedures, at a thickness between about 400 to 800 Angstroms. The polysilicon layer, doped in situ during deposition, via the addition of arsine, or phosphine, to a silane ambient, lines, or coats, the exposed surfaces of storage node openings 11, including overlying and contacting the top surface of conductive plug structures, located at the bottom of storage node openings 11. The regions of the polysilicon layer, located on the top surface of insulator layer 9, are removed via a CMP procedure, resulting in the creation of crown shaped storage node structures 12, in storage node openings 11. This is schematically shown in FIG. 5. Insulator layer 9, is next removed using a BHF solution. The use of an underlying silicon nitride layer, (not shown the drawings), allows selectivity to be achieved, with the wet etch process used for removal of the silicon oxide portion of composite insulator layer 9, terminating at the appearance of the silicon nitride layer. If desired the surface area of crown shaped storage node structures 12, can be increased via the formation of a hemispherical silicon grain, (HSG), layer, formed on the exposed surfaces of crown shaped storage node structures 12. This can be accomplished by growing a silicon seed layer, on the crown shaped storage node structure, via LPCVD procedures, followed by anneal procedures, used to convert the silicon seed layer, to the HSG layer.

Figure 6:
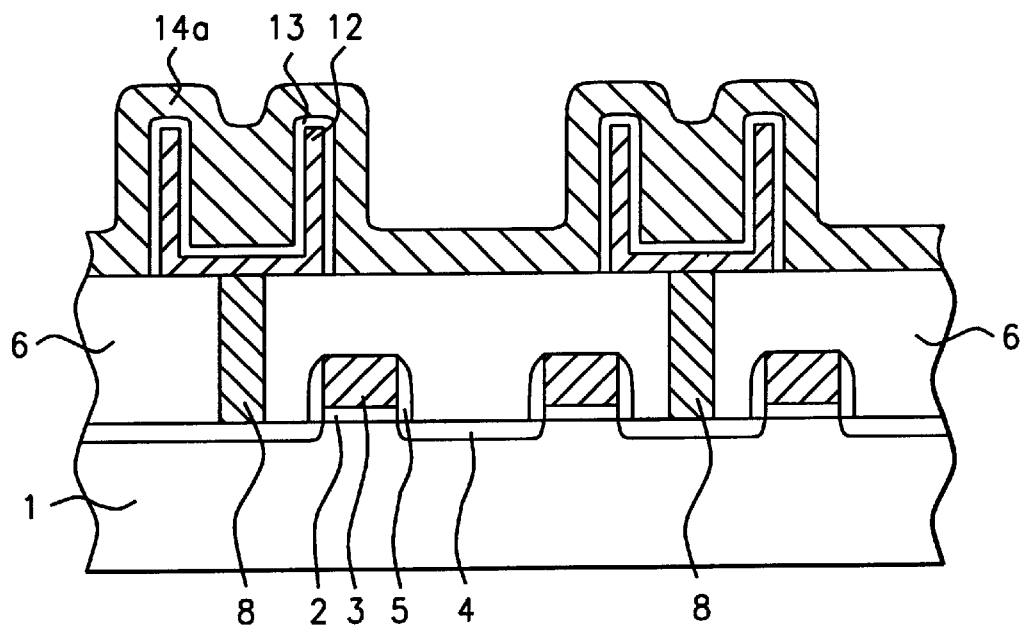

A capacitor dielectric layer 13, such as ONO, (oxidized silicon Nitride on Oxide), is formed on the crown shaped storage node structures, at an equivalent silicon oxide thickness between about 40 to 60 Angstroms. This is accomplished via the growth of a thin silicon oxide layer, on the surface of crown shaped storage node structures 12, followed by the deposition of a silicon nitride layer, via LPCVD or PECVD procedures, to a thickness between about 100 to 300 Angstroms. A thermal oxidation procedure is then employed to convert a portion, or the entire thickness of silicon nitride, to a silicon oxynitride layer, resulting in ONO layer 13. If desired capacitor dielectric layer 13, can be comprised of tantalum oxide. Polysilicon layer 14a, to be used in the formation of the subsequent polysilicon, capacitor upper plate structure, is next deposited via LPCVD procedures, to a thickness between about 500 to 1500 Angstroms. Polysilicon layer 14a, shown schematically in FIG. 6, is doped in situ, during deposition, via the addition of arsine, or phosphine, to a silane ambient.

Figure 7:
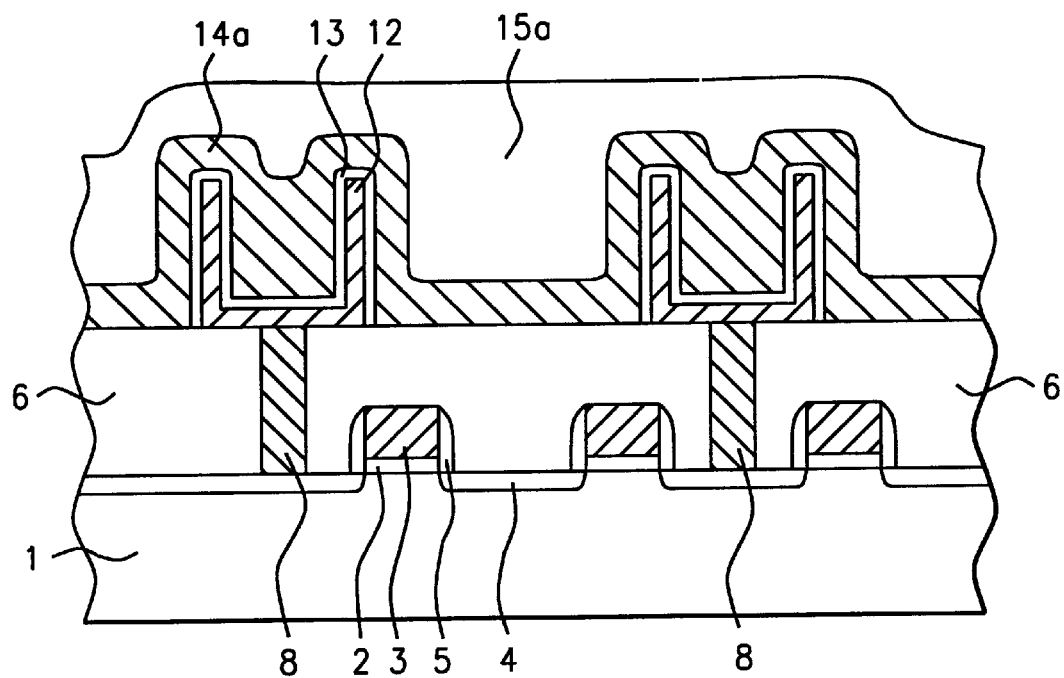

To define individual crown shaped capacitor structures, definition of polysilicon, capacitor upper plate structures, has to be performed via photolithographic and RIE procedures. The height of the vertical features of crown shaped storage node structures 12, presents difficulties when forming the photoresist shape, needed for definition of the capacitor upper plate structures, on this severe topography. To effectively cover the severe topography a thick photoresist shape is needed, however this can result in a loss of resolution for the photoresist shape used for definition of the capacitor upper plate structures. Therefore a spin on glass, (SOG), layer 15a, is used to fill the spaces between the vertical features of the crown shaped storage structures. SOG layer 15a, comprised of silicon oxide, is applied via spin on procedures, at a thickness between about 2000 to 6000 Angstroms. SOG layer 15a, schematically shown in FIG. 7, will be a disposable layer, used only during the definition of the capacitor upper plate structures, than selectively removed.

Figure 8:
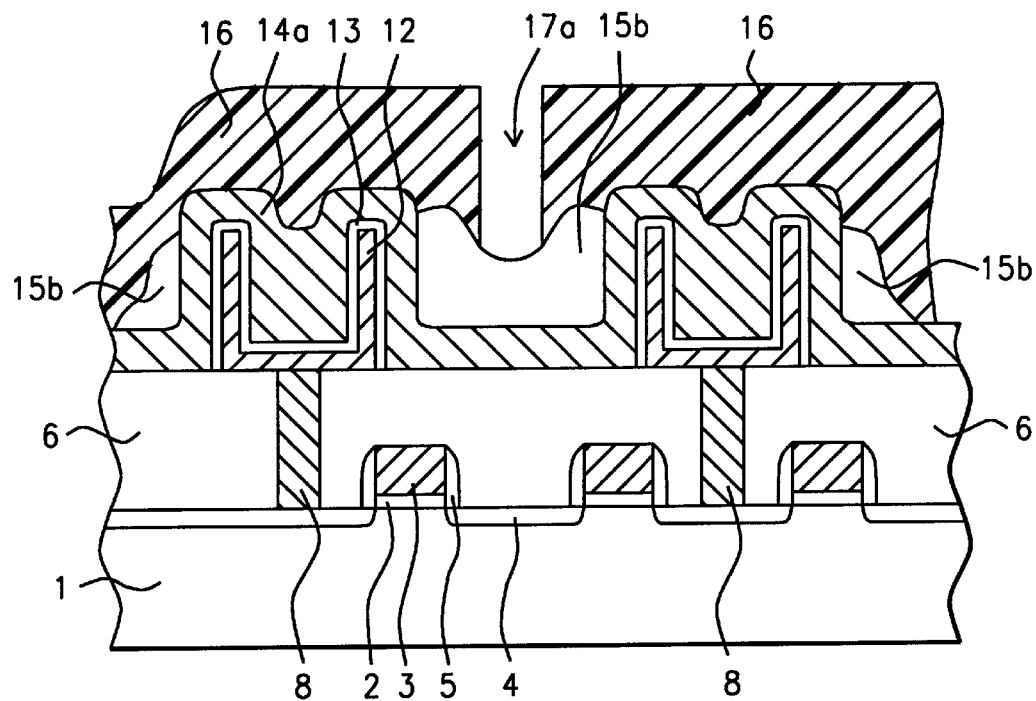
Figure 9:
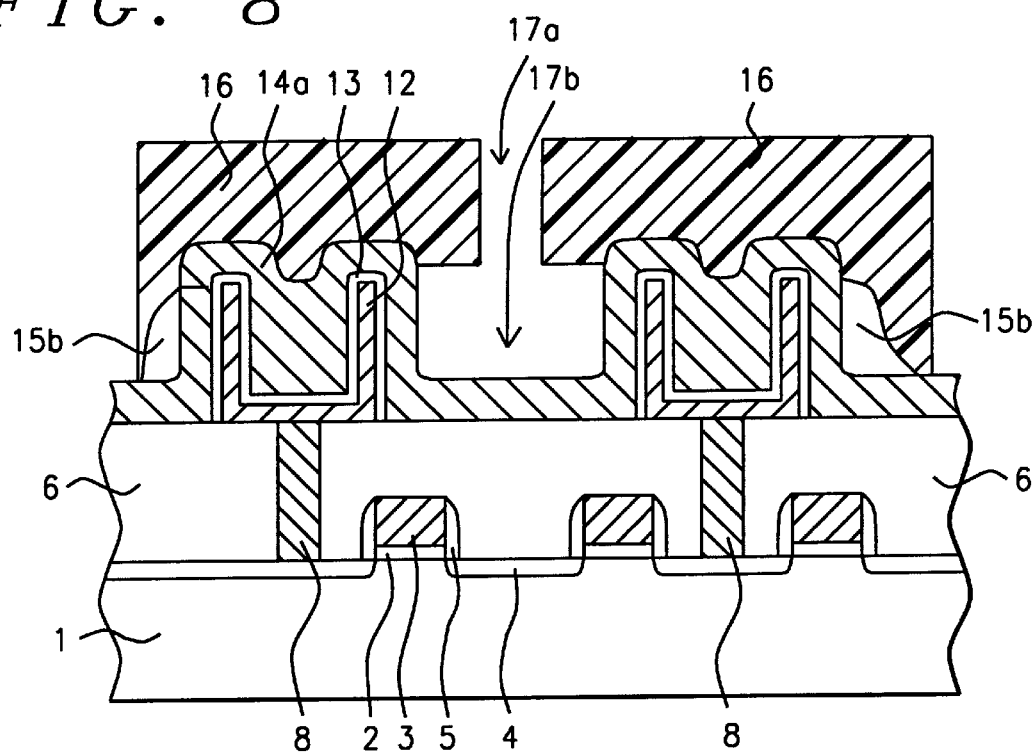

Prior to formation of the photoresist shape, used for definition of the capacitor upper plate structures, a timed BHF procedure is used to thin SOG layer 15a, resulting in SOG layer 15b, located in the space between subsequent crown shaped capacitor structures. This is schematically shown in FIG. 8. Photoresist shape 16, is next formed, featuring opening 17a, in photoresist shape 16, exposing a region of SOG layer 15b, directly overlying a portion of polysilicon layer 14a, which will subsequently be removed to allow individual crown shaped capacitor structures to be realized. This is also shown schematically in FIG. 8. The regions of SOG layer 15b, not protected by photoresist shape 16, are then removed via a selective BHF procedure, resulting in opening 17b, exposing a portion of the top surface of polysilicon layer 14a, in a region between subsequent crown shaped capacitor structures. The isotropic nature of the BHF wet etch procedure, results in a undercut of, or the removal of, SOG layer 15b, in the regions underlying photoresist shape 16, adjacent to opening 17a, thus creating opening 17b. This is schematically shown in FIG. 9.

Figure 10:
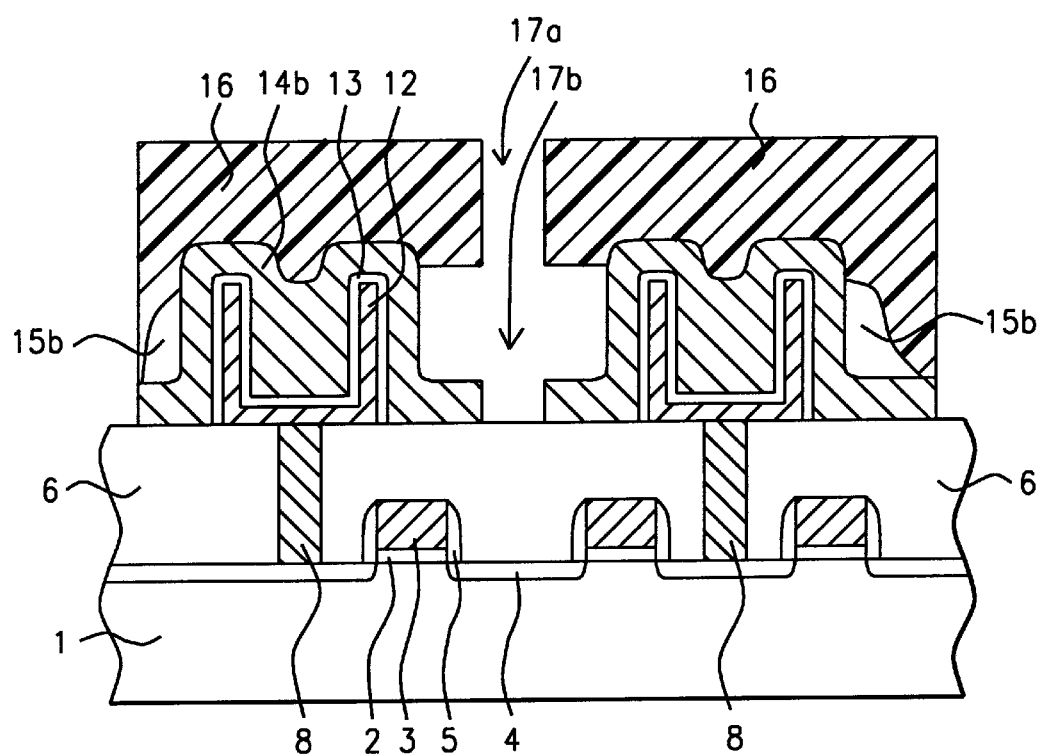
Figure 11:
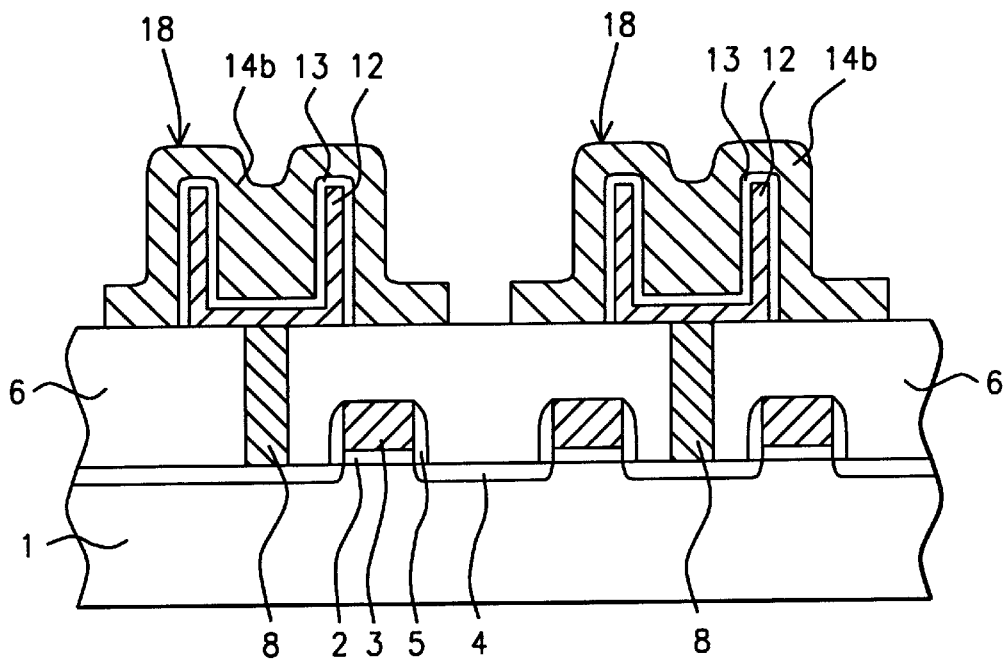

An anisotropic RIE procedure, using $Cl_2$ as an etchant, is used to remove regions of polysilicon layer 14a, exposed in opening 17a, in photoresist shape 16, resulting in the creation of polysilicon, capacitor upper plate structures 14b, schematically shown in FIG. 10. After removal of photoresist shape 16, via plasma oxygen ashing and careful wet cleans, regions of SOG layer 15b, still residing on the sides of the crown shaped capacitor structures, previously protected by photoresist shape 16, during the process to used form opening 17b, are now removed via wet BHF procedures. This results in the formation of individual crown shaped structures 18, each comprised with an overlying, polysilicon capacitor upper plate structure 14b, a capacitor dielectric layer 13, and a crown shaped storage node structure 12. This is schematically shown in FIG. 11. The complexity of forming the polysilicon, capacitor upper plate structures 14b, overlying the severe topography presented by the crown shaped storage node structures 12, is alleviated via the use of planarizing, disposable SOG regions.

While this invention has been particularly shown and described with reference to the preferred embodiments thereof, it will be understood by those skilled in the art that various changes in form and details may be made without departing from the spirit or scope of this invention.

What is claimed is:

1. A method of forming a capacitor structure on a semiconductor substrate, comprising the steps of:
   providing transfer gate transistors, with each transfer gate transistor comprised with a gate structure, on an underlying gate insulator layer, with insulator spacers on the sides of said gate structure, and with source/drain regions located in areas of said semiconductor substrate not covered by gate structures;
   forming conductive plug structures, in contact hole openings in a first insulator layer, with said conductive plug structures overlying, and contacting top portions of said source/drain regions;
   forming crown shaped storage node structures, on the top surface of said first insulator layer, and on the top surface of said conductive plug structures;
   forming a capacitor dielectric layer on the surfaces of said crown shaped storage node structures;
   depositing a polysilicon layer;
   applying a disposable insulator layer, filling the spaces between vertical features of said crown shaped storage node structures;
   performing a first wet etch procedure to thin said disposable insulator layer;
   performing a second wet etch procedure to form an opening in said disposable insulator layer, exposing a portion of said polysilicon layer, located between crown shaped storage node structures;
   removing the portion of said polysilicon layer, exposed in said opening in said disposable insulator layer, forming polysilicon upper plate structures; and
   performing a third wet etch procedure to remove regions of said disposable insulator layer from the sides of said polysilicon upper plate structures.

2. The method of claim 1, wherein said first insulator layer is a borophosphosilicate glass, (BPSG), layer, or a silicon oxide layer, obtained via LPCVD or PECVD procedures, at a thickness between about 8000 to 12000 Angstroms.

3. The method of claim 1, wherein said conductive plug structures are comprised of polysilicon, obtained via LPCVD procedures, and doped in situ, during deposition, via the addition of arsine, or phosphine, to a silane ambient.

4. The method of claim 1, wherein said crown shaped storage node structures are comprised of polysilicon.

5. The method of claim 1, wherein said polysilicon layer is obtained via LPCVD procedures, at a thickness between about 400 to 800 Angstroms, and doped in situ, during deposition, via the addition of arsine, or phosphine, to a silane ambient.

6. The method of claim 1, wherein said disposable insulator layer is a spin on glass, (SOG), layer, comprised of silicon oxide, and applied at a thickness between about 2000 to 6000 Angstroms.

7. The method of claim 1, wherein said first wet etch procedure, used to thin said disposable insulator layer, is performed using a BHF acid solution.

8. The method of claim 1, wherein said opening in said disposable insulator layer is formed via said second wet etch procedure, using a BHF acid solution as an etchant.

9. The method of claim 1, wherein said polysilicon upper plate structures are formed via an anisotropic RIE procedure, using $Cl_2$ as an etchant, applied to regions of said polysilicon layer, exposed in said opening in said disposable insulator layer.

10. A method of forming a crown shaped capacitor structure, for a DRAM device, on a semiconductor substrate, featuring the use of a disposable insulator layer, used to reduce the topography effects presented by crown shaped storage nodes structures, that can adversely influence the definition of capacitor upper plate structures, comprising the steps of:
   providing transfer gate transistors, on said semiconductor substrate, with each transfer gate transistor comprised with a gate structure, on a gate insulator layer, and comprised with source/drain regions, located in areas of said semiconductor substrate, not covered by the gate structures;
   depositing a first insulator layer;
   opening contact holes in said first insulator layer, exposing a portion of the top surfaces of said source/drain regions;
   forming conductive plug structures in said contact hole openings;
   depositing a second insulator layer;

forming storage node openings in said second insulator layer, exposing the top surface of said conductive plug structures;

depositing a first polysilicon layer;

removing the portion of said polysilicon layer from the top surface of said second insulator layer, forming said crown shaped storage node structures, in said storage node openings;

removing said second insulator layer;

forming a capacitor dielectric layer on said crown shaped capacitor structures;

depositing a second polysilicon layer;

depositing said disposable insulator layer, filling the spaces between said crown shaped storage node structures, and filling the spaces between vertical features of said crown shaped storage node structures;

performing a first BHF procedure to thin said disposable insulator layer;

using a photoresist shape as a mask, to form an opening in said disposable insulator layer, via a second BHF procedure, exposing a portion of said second polysilicon layer, located between said crown shaped storage node structures;

using said photoresist shape as a mask to remove the portion of said second polysilicon layer, exposed in said opening, in said disposable insulator layer, creating said capacitor upper plate structures; and performing a third BHF procedure to remove regions of said disposable insulator layer, from the sides of said capacitor upper plate structures.

11. The method of claim 10, wherein said first insulator layer is a borophosphosilicate glass, (BPSG), layer, or a silicon oxide layer, obtained via LPCVD or PECV procedures, at a thickness between about 8000 to 12000 Angstroms.

12. The method of claim 10, wherein said conductive plug structures are comprised of in situ doped, polysilicon, obtained via LPCVD procedures, and defined via CMP procedures.

13. The method of claim 10, wherein said second insulator layer is a silicon oxide, or a BPSG layer, obtained via LPCVD or PECVD procedures, at a thickness between about 10000 to 16000 Angstroms.

14. The method of claim 10, wherein said second insulator layer is a composite insulator layer, comprised of an underlying silicon nitride layer, and an overlying silicon oxide layer.

15. The method of claim 10, wherein said first polysilicon layer is obtained via LPCVD procedures, at a thickness between about 400 to 800 Angstroms, and doped in situ, during deposition, via the addition of arsine, or phosphine, to a silane ambient.

16. The method of claim 10, wherein said second polysilicon layer is obtained via LPCVD procedures, at a thickness between about 500 to 1500 Angstroms, and doped in situ, during deposition, via the addition of arsine, or phosphine, to a silane ambient.

17. The method of claim 10, wherein said disposable insulator layer is a spin on glass, (SOG), layer, comprised of silicon oxide, applied at a thickness between about 2000 to 6000 Angstroms.

18. The method of claim 10, wherein said capacitor upper plate structures are defined via an anisotropic RIE procedure, using $Cl_2$ as an etchant.

* * * * *